US009685585B2

(12) United States Patent
Gupta et al.

(10) Patent No.: US 9,685,585 B2
(45) Date of Patent: Jun. 20, 2017

(54) QUANTUM DOT NARROW-BAND DOWNCONVERTERS FOR HIGH EFFICIENCY LEDS

(71) Applicant: Cree, Inc., Durham, NC (US)

(72) Inventors: Nalini Gupta, Santa Barbara, CA (US); James Ibbetson, Santa Barbara, CA (US); Bernd Keller, Santa Barbara, CA (US)

(73) Assignee: CREE, INC., Durham, NC (US)

( * ) Notice: Subject to any disclaimer, the term of this patent is extended or adjusted under 35 U.S.C. 154(b) by 16 days.

(21) Appl. No.: 13/837,442

(22) Filed: Mar. 15, 2013

(65) Prior Publication Data

US 2013/0341590 A1 Dec. 26, 2013

Related U.S. Application Data

(60) Provisional application No. 61/663,724, filed on Jun. 25, 2012.

(51) Int. Cl.
| | |
|---|---|
| *H01L 33/06* | (2010.01) |
| *H01L 33/08* | (2010.01) |
| *H01L 33/50* | (2010.01) |
| *H01L 33/14* | (2010.01) |
| *H05B 33/14* | (2006.01) |

(52) U.S. Cl.
CPC ............. *H01L 33/06* (2013.01); *H01L 33/08* (2013.01); *H01L 33/502* (2013.01); *H05B 33/14* (2013.01)

(58) Field of Classification Search
CPC ....... H01L 33/08; H01L 33/502; H01L 33/14; H01L 33/06
USPC ........................................... 257/13
See application file for complete search history.

(56) References Cited

U.S. PATENT DOCUMENTS

| 4,946,547 A | 8/1990 | Palmour ...................... 156/643 |
| 4,992,302 A | 2/1991 | Lindmayer ..................... 427/70 |
| 5,200,022 A | 4/1993 | Kong ............................. 156/612 |
| RE34,861 E | 2/1995 | Davis ............................ 999/100 |

(Continued)

FOREIGN PATENT DOCUMENTS

| DE | 3315675 A | 11/1983 |
| DE | 9013615 U | 12/1990 |

(Continued)

OTHER PUBLICATIONS

Ohno, "Spectral design consideration for white LED color rendering," Optical Engineering 44(11), 111302 (Nov. 2005), pp. (111302-)1-9.*

(Continued)

*Primary Examiner* — Jarrett Stark
*Assistant Examiner* — Charles N Ausar-El
(74) *Attorney, Agent, or Firm* — Koppel, Patrick, Heybl & Philpott

(57) ABSTRACT

The present disclosure is directed to LED components, methods and systems using such components, having light emitter devices with emissions tuned to meet CRI and LER goal values at a defined CCT. These emitter devices and methods may use a combination of light emitting diodes and quantum dots to tune the emission to meet these criteria. The quantum dots may incorporate additional features to protect the quantum dots from environmental conditions and improve heat dissipation, such as coatings and thermally conductive features.

54 Claims, 11 Drawing Sheets

(56) References Cited

U.S. PATENT DOCUMENTS

| | | | |
|---|---|---|---|
| 5,684,309 A | 11/1997 | McIntosh et al. | 257/191 |
| 5,753,933 A | 5/1998 | Morimoto | 257/14 |
| 5,757,026 A | 5/1998 | Forrest et al. | 257/40 |
| 5,813,753 A | 9/1998 | Vriens et al. | 362/293 |
| 5,898,185 A | 4/1999 | Bojarczuk, Jr. et al. | 257/103 |
| 5,952,681 A | 9/1999 | Chen | 257/89 |
| 5,959,316 A | 9/1999 | Lowery | 257/98 |
| 6,093,941 A | 7/2000 | Russell et al. | 257/103 |
| 6,166,489 A | 12/2000 | Thompson et al. | 313/506 |
| 6,212,213 B1 | 4/2001 | Weber et al. | 372/50 |
| 6,239,901 B1 | 5/2001 | Kaneko | 359/326 |
| 6,255,669 B1 | 7/2001 | Birkhahn et al. | 257/89 |
| 6,337,536 B1 | 1/2002 | Matsubara et al. | 313/498 |
| 6,667,185 B2 | 12/2003 | Ishibashi et al. | 438/22 |
| 6,803,719 B1* | 10/2004 | Miller | B82Y 10/00 257/100 |
| 7,083,490 B2* | 8/2006 | Mueller | H01L 33/501 257/E33.059 |
| 7,095,056 B2 | 8/2006 | Vitta et al. | |
| 7,196,354 B1* | 3/2007 | Erchak et al. | 257/79 |
| 7,213,940 B1 | 5/2007 | Van De Ven et al. | |
| 8,455,898 B2* | 6/2013 | Anc | H01L 33/504 257/98 |
| 8,513,872 B2* | 8/2013 | Annen | B82Y 30/00 313/483 |
| 8,759,850 B2* | 6/2014 | Coe-Sullivan et al. | 257/89 |
| 8,921,875 B2* | 12/2014 | LeToquin | H01L 25/0753 257/13 |
| 2003/0205714 A1 | 11/2003 | Sugawara et al. | 257/89 |
| 2004/0036130 A1* | 2/2004 | Lee et al. | 257/409 |
| 2004/0129944 A1 | 7/2004 | Chen | 257/89 |
| 2004/0245912 A1 | 12/2004 | Thurk et al. | 313/484 |
| 2005/0017260 A1* | 1/2005 | Lee | 257/187 |
| 2008/0149166 A1* | 6/2008 | Beeson et al. | 136/248 |
| 2008/0173886 A1* | 7/2008 | Cheon | C09K 11/02 257/98 |
| 2008/0246017 A1* | 10/2008 | Gillies | B82Y 20/00 257/13 |
| 2008/0296555 A1* | 12/2008 | Miller et al. | 257/14 |
| 2009/0272996 A1* | 11/2009 | Chakraborty | 257/98 |
| 2010/0283036 A1* | 11/2010 | Coe-Sullivan et al. | 257/13 |
| 2011/0186811 A1* | 8/2011 | Coe-Sullivan et al. | 257/13 |
| 2011/0222277 A1* | 9/2011 | Negley | H01L 33/504 362/235 |
| 2011/0303940 A1* | 12/2011 | Lee et al. | 257/98 |
| 2011/0305002 A1* | 12/2011 | Lim et al. | 362/84 |
| 2012/0195340 A1* | 8/2012 | Cheon | H01L 33/501 372/50.1 |
| 2012/0286238 A1* | 11/2012 | Linton et al. | 257/13 |
| 2013/0009131 A1* | 1/2013 | Kazlas et al. | 257/13 |
| 2013/0016499 A1* | 1/2013 | Yee et al. | 362/97.1 |
| 2013/0094177 A1* | 4/2013 | Edwards | 362/84 |
| 2013/0099264 A1* | 4/2013 | Zimmerman et al. | 257/89 |
| 2013/0193407 A1* | 8/2013 | Clough et al. | 257/13 |
| 2013/0200334 A1* | 8/2013 | Zhang et al. | 257/13 |
| 2013/0234109 A1* | 9/2013 | Breen et al. | 257/13 |
| 2013/0240829 A1* | 9/2013 | Kuramachi | H01L 21/02458 257/9 |
| 2013/0258636 A1* | 10/2013 | Rettke | H01L 25/0753 362/84 |
| 2013/0277643 A1* | 10/2013 | Williamson et al. | 257/13 |
| 2013/0326941 A1* | 12/2013 | Pickett et al. | 47/1.4 |
| 2014/0021440 A1* | 1/2014 | Mahan et al. | 257/13 |
| 2014/0061584 A1* | 3/2014 | Mahan | H01L 23/4334 257/13 |

FOREIGN PATENT DOCUMENTS

| | | | |
|---|---|---|---|
| DE | 19645035 C1 | 4/1998 | H04N 9/30 |
| EP | 1142034 | 10/2001 | |
| JP | 05152609 A | 6/1993 | |
| JP | 08007614 A | 1/1996 | |
| JP | 10056203 | 2/1998 | H01L 33/00 |
| WO | WO9750132 | 12/1997 | |
| WO | WO9812757 | 3/1998 | |
| WO | WO 0124285 A1 | 4/2001 | |

OTHER PUBLICATIONS

Demir et al, "Photometric design of color-conversion LEDs", SPIE Newsroom 10.117/2.1201102.003507 1-3 copyright 2011 SPIE.*
Erdem et al, "A photometric investigation of ultra-efficient LEDs with high color rendering index and high luminous efficacy employing nanocrystal quantum dot luminophores", Jan. 4, 2010/ vol. 18, No. 1/ Optics Express 340.*
Office Action from U.S. Appl. No. 11/545,131, dated Mar. 10, 2014.
Examination Report from European Patent Appl. No. 03075791.8, dated Feb. 27, 2013.
Publication No. US 2002/0003233 A1, Jan. 10, 2002, Mueller-Mach et al., 257/84.
European Office Action for counterpart application No. 03 075 791.8, Feb. 19, 2010.
Powell, Physics of Solid-State Laser Materials, 1998, Springer-Verlag New York, Inc., pp. 215-253.
Patents Abstracts of Japan, 05152609 A, Jun. 18, 1993, Yoshiaki, H01L 33/00.
Patents Abstracts of Japan, 08007614 A, Jan. 12, 1996, Yoshinori, H01L 33/00.
Prentice Hall, *Laser Electronics* 2$^{nd}$ *Edition*, J.T. Verdeyen, p. 363 1989.
Nichia Corp. White LED, Part Nos. NSPW300BS, NSPW312BS, pp. 1-3. (1999).
Jpn. J. Appl Phys. vol. 42 (2003)pp. 4197-4202, Part 1 No. 7A, Jul. 2003, Control of Emission Wavelength of Gainn Single Quantum Well, Light Emitting Diodes Grown by Metalorganic Chemical Vapor Deposition in a Split-Plow Reactor, Yamashita et al.
Journal of Applied Physics 35(Mar. 2002) pp. 604-608 "Light Emission Ranging From Blue to Red From a Series of INGAN/GAN Single Quantum Wells"., Martin et al.
Jpn. J. Appl. Physics. vol. 38 (Apr. 1999), pp. 3976-3981, "Characteristics of INGAN-Based UV/Blue/Green/Amber/Red Light-Emitting Diodes".
U.S. Appl. No. 13/192,755, filed Jul. 2011, Van de Ven.
U.S. Appl. No. 13/292,577, filed Nov. 2011, Negley.
U.S. Appl. No. 13/029,025, filed Feb. 2011, Tong, et al.
Response to Final OA from U.S. Appl. No. 11/545,131, dated Mar. 12, 2012.
Office Action from U.S. Appl. No. 11/545,131, dated: Feb. 15, 2012.
Response to Final OA from U.S. Appl. No. 11/545,131, dated: Feb. 2, 2012.
Office Action from U.S. Appl. No. 11/545,131, dated: Dec. 13, 2011.
Response to OA from U.S. Appl. No. 11/545,131, dated: Aug. 13, 2011.
Office Action from U.S. Appl. No. 11/545,131, dated May 13, 2011.
Response to Office Action from U.S. Appl. No. 11/545,131, dated Jun. 18, 2010.
Office Action from U.S. Appl. No. 11/545,131, dated Feb. 18, 2010.
Response to OA from U.S. Appl. No. 11/545,131, dated: Dec. 1, 2009.
Office Action from U.S. Appl. No. 11/545,131, dated: Jul. 1, 2009.
Response to Office Action from U.S. Appl. No. 11/545,131, dated: Apr. 6, 2009.
Office Action from U.S. Appl. No. 11/545,131, dated: Dec. 4, 2008.
Response to Office Action from U.S. Appl. No. 11/545,131, dated Sep. 11, 2008.
Office Action from U.S. Appl. No. 11/545,131, dated: Apr. 11, 2008.

* cited by examiner

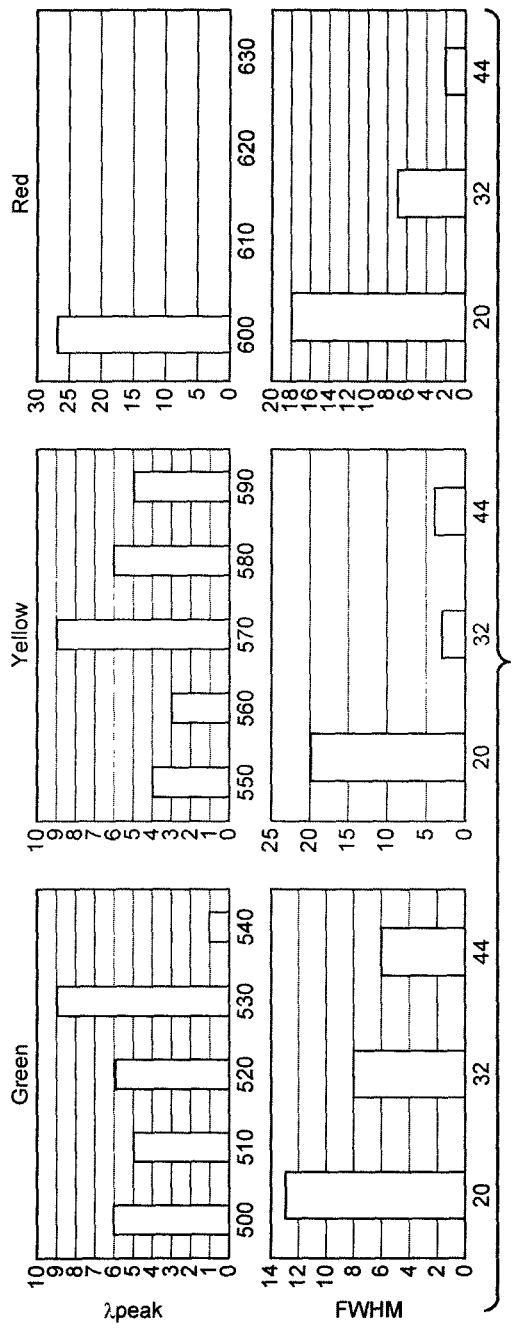

| Input | Component | Peak Wavelength |
|---|---|---|
| 1 | LED | 455 - 460 nm |
| 2 | Narrow-band emitter | 520 - 535 nm |
| 3 | Narrow-band emitter | 585 - 595 nm |
| 4 | Narrow-band emitter | 618 - 622 nm |

| Input | Component | Peak Wavelength |
|---|---|---|
| 1 | LED | 455 - 460 nm |
| 2 | Narrow-band emitter | 525 - 535 nm |
| 3 | Narrow-band emitter | 585 - 595 nm |
| 4 | Narrow-band emitter | 605 - 625 nm |

QUANTUM DOT NARROW-BAND DOWNCONVERTERS FOR HIGH EFFICIENCY LEDS

CROSS REFERENCE TO RELATED APPLICATIONS

This application claims the benefit of U.S. Provisional Patent Application No. 61/663,724, filed on Jun. 25, 2012, entitled "QUANTUM DOT NARROW-BAND DOWNCONVERTERS FOR HIGH EFFICIENCY LEDS."

BACKGROUND OF THE INVENTION

Field of the Invention

The present invention relates to solid state lighting devices, including devices with narrow-band emitters stimulated by at least one solid state light emitter, and methods of making and using same.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Solid state light sources may be utilized to provide colored (e.g., non-white) or white LED light (e.g., perceived as being white or near-white). White solid state emitters have been investigated as potential replacements for white incandescent lamps due to reasons including substantially increased efficiency and longevity. Longevity of solid state emitters is of particular benefit in environments where access is difficult and/or where change-out costs are extremely high.

A solid state lighting device may include, for example, at least one organic or inorganic light emitting diode ("LED") or a laser. A solid state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid state emitter depends on the materials of the active layers thereof. Solid state light sources provide potential for very high efficiency relative to conventional incandescent or fluorescent sources, but present challenges in simultaneously achieving good efficacy, good color reproduction, and color stability (e.g., with respect to variations in operating temperature).

Color reproduction is commonly measured using Color Rendering Index (CRI) or average Color Rendering Index (CRI Ra). In the calculation of the CRI, the color appearance of 14 reflective samples is simulated when illuminated by a reference illuminant and the test source. The difference in color appearance $\Delta E_i$, for each sample, between the test and reference illumination, is computed in CIE 1964 W*U*V* uniform color space. It therefore, provides a relative measure of the shift in surface color and brightness of an object when lit by a particular lamp. The general color rendering index CRI Ra is a modified average utilizing the first eight indices, all of which have low to moderate chromatic saturation. The $9^{th}$ indice (R9) may also be significant as the R9 essentially demonstrates how well a lamp shows off a strong red. This is important for warmer color temperatures, as there is much more red in the spectrum. A high R9 (greater than 0) is commonly expected in order to mimic a "warm candle light" type color. The CRI Ra equals 100 (a perfect score) if the color coordinates and relative brightness of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80) for general illumination use where the colors of objects are not important. For some general interior illumination, a CRI Ra>80 is acceptable. CRI Ra>85, and more preferably, CRI Ra>90, provides greater color quality.

CRI only evaluates color rendering, or color fidelity, and ignores other aspects of color quality, such as chromatic discrimination and observer preferences. The Color Quality Scale (CQS) developed by National Institute of Standards and Technology (NIST) is designed to incorporate these other aspects of color appearance and address many of the shortcomings of the CRI, particularly with regard to solid-state lighting. The method for calculating the CQS is based on modifications to the method used for the CRI, and utilizes a set of 15 Munsell samples having much higher chroma than the CRI indices.

Aspects relating to the present inventive subject matter may be better understood with reference to the 1931 CIE (Commission International de l'Eclairage) Chromaticity Diagram, which is well-known and readily available to those of ordinary skill in the art. The 1931 CIE Chromaticity Diagram maps out the human color perception in terms of two CIE parameters x and y. The spectral colors are distributed around the edge of the outlined space, which includes all of the hues perceived by the human eye. The boundary line represents maximum saturation for the spectral colors.

The chromaticity coordinates (i.e., color points) that lie along the blackbody locus obey Planck's equation: $E(\lambda)=A \lambda-5/(e^{B/T}-1)$, where E is the emission intensity, $\lambda$ is the emission wavelength, T the color temperature of the blackbody, and A and B are constants. Color coordinates that lie on or near the Planckian blackbody locus (BBL) yield pleasing white light to a human observer. The 1931 CIE Diagram includes temperature listings along the blackbody locus (embodying a curved line emanating from the right corner). These temperature listings show the color path of a blackbody radiator that is caused to increase to such temperatures. As a heated object becomes incandescent, it first glows reddish, then yellowish, then white, and finally bluish. This occurs because the wavelength associated with the peak radiation of the blackbody radiator becomes progressively shorter with increased temperature. Illuminants that produce light on or near the BBL can thus be described in terms of their color temperature.

The term "white light" or "whiteness" does not clearly cover the full range of colors along the BBL since it is apparent that a candle flame and other incandescent sources appear yellowish, i.e., not completely white. Accordingly, the color of illumination may be better defined in terms of correlated color temperature (CCT) and in terms of its proximity to the BBL. The pleasantness and quality of white illumination decreases rapidly if the chromaticity point of the illumination source deviates from the BBL by a distance of greater than 0.01 in the x, y chromaticity system. This corresponds to the distance of about 4 MacAdam ellipses, a standard employed by the lighting industry. A lighting device emitting light having color coordinates that are within 4 MacAdam step ellipses of the BBL and that has a CRI Ra>80 is generally acceptable as a white light for illumination purposes. A lighting device emitting light having color coordinates within 7 MacAdam ellipses of the BBL and that has a CRI Ra>70 is used as the minimum standards for many other white lighting devices including compact fluorescent and solid state lighting devices.

General illumination generally has a color temperature between 2,000 K and 10,000 K, with the majority of lighting devices for general illumination being between 2,700 K and 6,500 K. The white area is proximate to (i.e., within approximately 8 MacAdam ellipses of) the BBL and between 2,500 K and 10,000 K.

Because light that is perceived as white is necessarily a blend of light of two or more colors (or wavelengths), and light emitting diodes are inherently narrow-band emitters. No single light emitting diode junction has been developed that can produce white light. A representative example of a white LED lamp or LED package includes a blue LED chip (e.g., made of InGaN and/or GaN), coated with a broad-band emitter, such as phosphor (typically YAG:Ce or BOSE). A broad-band emitter generally has an emission pattern with an approximate full width half maximum (FWHM) greater than 100 nm. Blue LEDs made from InGaN exhibit high efficiency (e.g., external quantum efficiency as high as 70%). In a blue LED/yellow phosphor lamp, a blue LED chip may produce an emission with a wavelength of about 450 nm, and the phosphor may produce yellow fluorescence with a peak wavelength of about 550 nm upon receipt of the blue emission. Part of the blue ray emitted from the blue LED chip passes through the phosphor, while another portion of the blue ray is absorbed by the phosphor, which becomes excited and emits a yellow ray. The viewer perceives an emitted mixture of blue and yellow light (sometimes termed 'blue shifted yellow' or 'BSY' light) as cool white light. A BSY device typically exhibits good efficacy but only medium CRI Ra (e.g., between 60 and 75), or very good CRI Ra and low efficacy. Cool white LEDs have a color temperature of approximately 5,000 K, which is generally not visually comfortable for general illumination, but may be desirable for the illumination of commercial goods or advertising and printed materials.

Various methods exist to enhance cool white light to increase its warmth. Acceptable color temperatures for indoor use are typically in a range of from 2,700-3,750 K; however, warm white LED devices may be on the order of only half as efficient as cool white LED devices. To promote warm white colors, an orange phosphor or a combination of a red phosphor (e.g., CaAlSiN3 ('CASN') based phosphor) and yellow phosphor (e.g., Ce:YAG or YAG:Ce) can be used in conjunction with a blue LED. Cool white emissions from a BSY element (including a blue emitter and yellow phosphor) may also be supplemented with a red LED (with such combination being referred to hereinafter as "BSY+R"), such as disclosed by U.S. Pat. No. 7,095,056 to Vitta, et al. and U.S. Pat. No. 7,213,940 to Negley, et al., to provide warmer light. While such devices permit the correlative color temperature (CCT) to be changed, the CRI of such devices may be reduced at elevated color temperatures.

As an alternative to stimulating a yellow phosphor with a blue LED, another method for generating white emissions involves combined use of red, green, and blue ("RGB") light emitting diodes in a single package. The combined spectral output of the red, green, and blue emitters may be perceived by a user as white light. Each "pure color" red, green, and blue diode typically has a full-width half-maximum (FWHM) wavelength range from about 15 nm to about 30 nm. Due to the narrow FWHM values of these LEDs (particularly the green and red LEDs), aggregate emissions from the red, green, and blue LEDs exhibit very low color rendering in general illumination applications. Moreover, use of AlInGaP-based red LEDs in conjunction with nitride-based blue and/or green LEDs entails color stability issues, since the efficacy of red LEDs declines more substantially at elevated operating temperatures than does the efficacy of blue and green LEDs.

Another example of a known white LED lamp includes one or more ultraviolet (UV)-based LEDs combined with red, green, and blue phosphors. Such lamps typically provide reasonably high color rendering, but exhibit low efficacy due to substantial Stokes losses.

The highest efficiency LEDs today are blue LEDs made from InGaN. Commercially available devices have external quantum efficiency (EQE) as great as 60%. The highest efficiency phosphors suitable for LEDs today are YAG:Ce and BOSE phosphor with a peak emission around 555 nm. YAG:Ce has a quantum efficiency of >90% and is an extremely robust and well-tested phosphor. White LED lamps made with InGaN-based blue LEDs and YAG:Ce phosphors typically have a CRI Ra of between 70 and 80.

It would also be desirable to provide improved color rendering (e.g., warm white) lighting devices with improved efficacy, with improved color stability at high flux, and/or with longer duration of service. It has also been proposed to produce LEDs of varying colors by the use of narrow-band emitters (instead of phosphors), such as quantum dots. Narrow-band emitters are generally those emitters, which have an approximate full width half maximum (FWHM) less than 100 nm.

A quantum dot (semiconductor nanocrystallites) is a material, generally semiconductor material, having a crystalline structure only a few nanometers in size, and typically includes about a few hundred atoms to about a few thousand atoms. Because of their small size, quantum dots display unique optical and electrical properties that are different in character to those of the corresponding bulk material. The most immediately apparent of these is the emission of photons under excitation, which are visible to the human eye as light. Quantum dots absorb and emit light at wavelengths determined by their size. Quantum confinement of both the electron and hole in all three dimensions leads to an increase in the effective band gap of the material with decreasing crystallite size. Consequently, both the optical absorption and emission of quantum dots shift to the blue (higher energies) as the size of the dots gets smaller and shift to the red as the size of the dots increase. It has been found that a CdSe quantum dot, for example, can emit light in any monochromatic, visible color, where the particular color characteristic of that dot is dependent only on its size. Dots can even be tuned beyond visible light, into the infra-red or into the ultra-violet. The light emitting characteristics of the quantum dot can be adjusted by controlling the size and composition of the quantum dot, and therefore the quantum dot may be employed in various light emitting devices. However, quantum dots may lack stability, at least in part due to their small size, in some environments, impacted by heat and oxidation.

SUMMARY OF THE INVENTION

Some embodiments of the present invention comprise light emitter devices and methods for tuning emission to meet Color Rendering Index (CRI) and lumens efficiency of radiation (LER) goals at a defined color correlated temperature (CCT). These emitter devices and methods may use a combination of light emitting diodes and quantum dots to tune the emission to meet these criteria. The quantum dots may incorporate additional features to protect the quantum dots from environmental conditions and improve heat dissipation, such as coatings and thermally conductive features.

One configuration comprises, a light emitting device, comprising a first light emitter. The device further includes narrow-band emitters, such that the light emitter and narrow-band emitters in combination provide an emission profile at a designated CCT with the desired CRI and LER characteristics.

Another configuration includes, a light emitting device, comprising a first light emitter. The device also includes at least three pluralities of narrow-band emitters, each of these pluralities emitting at a different peak wavelength range, such that the light emitter and the pluralities of narrow-band emitters in combination provide a spectral emission profile at a designated CCT with the desired CRI and LER characteristics.

Yet another configuration comprises, a light emitting device, comprising a first light emitter. The device also includes a plurality of narrow-band emitters arranged to reduce environmental damage to the plurality of narrow-band emitters. The plurality of narrow-band emitters also include a heat dissipation feature.

Another configuration includes, a method of tuning emitter package output, comprising providing a light emitter. The method further including providing a plurality of narrow-band emitters with a plurality of peak wavelength ranges chosen to achieve a designated CCT at a desired CRI value and a desired LER value.

These and other further features and advantages of the invention would be apparent to those skilled in the art from the following detailed description, taken together with the accompanying drawings, in which:

BRIEF DESCRIPTION OF THE DRAWINGS

FIG. 6 is a set of graphs showing the peak wavelengths and FWHM values for a subset of points from the graph of FIG. 5.

FIG. 7 is a table showing further details for a subset of points from the graphs of FIGS. 5 and 6.

FIG. 15 is a spectral graph for a configuration according to one portion of the range disclosed in FIG. 13a.

DETAILED DESCRIPTION OF THE INVENTION

Figure 1:
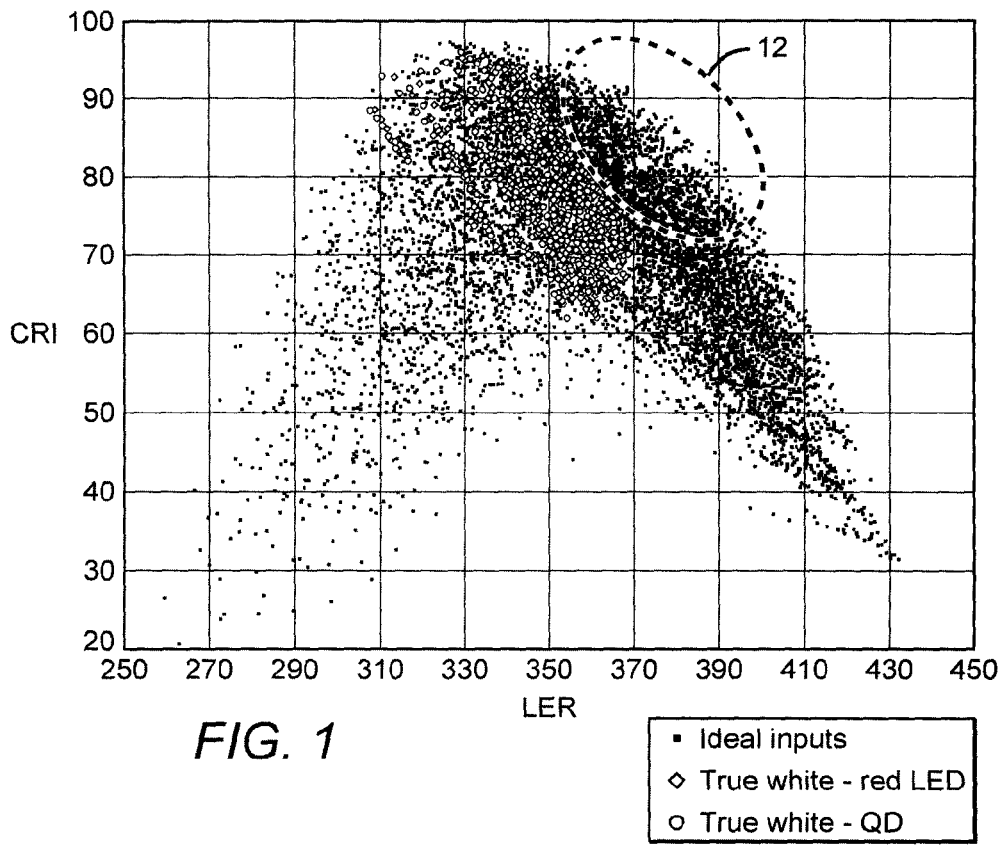
FIG. 1 is a graph depicting a comparison of CRI vs. LER computational results at a 4,000 K.

Traditional inorganic phosphor downconverter materials lack in emission spectra flexibility and therefore, limit the maximum efficiency and/or color quality output of the resulting LEDs. Embodiments of the invention described herein use spectral engineering to define a novel set of narrow-band emissions to improve the efficiency and color quality of the resulting white LEDs. The narrow-band emitters comprise nano-sized semi-conductors with a wide range of spectral emissions. Narrow-band emitters may also comprise light emitting diodes. Replacing some or all of the traditional downconverter materials with narrow-band emitters provides for a modular design platform to maximize the efficiency and color quality of white LED devices. The use of additional and multiple wavelength conversion materials are shown and described in U.S. patent application Ser. No. 13/292,577, to Gerald H. Negley, entitled "Solid State Lighting Device Including Multiple Wavelength Conversion Materials," which is commonly owned with the present application and incorporated by reference herein. It should be understood that though phosphors may be referenced as an exemplary broad-band emitter, in other embodiments other broad-band emitters may be incorporated. Furthermore, though quantum dots may be referenced as an exemplary narrow-band emitter, in other embodiments other narrow-band emitters may be incorporated.

The present invention is described herein with reference to certain embodiments; however, it is understood that the invention can be embodied in many different forms and should not be limited to the embodiments set forth herein. In particular, the LED chips described herein can comprise many different layers and elements beyond those described herein.

Embodiments of the present invention are described herein with reference to conversion materials, wavelength conversion materials, phosphors, phosphor layers and related terms. The use of these terms should not be construed as limiting. It is understood that the use of the term phosphor, or phosphor layers is meant to encompass and be equally applicable to all wavelength conversion materials.

The term "color" as used herein with reference to light is meant to describe light having a characteristic average wavelength; it is not meant to limit the light to a single wavelength. Thus, light of a particular color (e.g., green, red, blue, yellow, etc.) includes a range of wavelengths that are grouped around a particular average wavelength.

It is also understood that when an element such as a layer or material is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or region to another layer or region. It is understood that these terms are intended to encompass different orientations of the device, in addition to the orientation depicted in the figures.

Although the ordinal terms first, second, etc. may be used herein to describe various elements, components, regions, layers and/or materials, these elements, components, regions, layers and/or materials should not be limited by these terms. These terms are only used to distinguish one element, component, region, layer or material from another element, component, region, layer or material. Thus, a first element, component, region, layer or material discussed below could be termed a second element, component, region, layer or material without departing from the teachings of the present invention.

Embodiments of the invention are described herein with reference to cross-sectional view illustrations that are schematic illustrations of embodiments of the invention. The figures are not drawn to scale. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions/layers illustrated in the figures are schematic in nature. Their shapes are not intended to illustrate the precise shape of a region/layer of a device and are not intended to limit the scope of the invention.

Nano-sized semi-conductors or "quantum dots" lack stability under the harsh conditions created with high powered LEDs. Embodiments of this invention describe methods of reducing the environmental impact on quantum dots by incorporating the quantum dots within an inert material. The resulting structure is used to preserve the optical properties of the quantum dots by creating a physical barrier between the quantum dots and the surrounding environment. Additionally, the surrounding material can have an active role, such as heat dissipation from the quantum dots or providing scattering properties.

Embodiments of the invention utilize a novel method of spectral engineering of white LEDs that allows for greater control over the final emission spectra to create a greater portfolio of either color-specific or color-combined white lighting. Current technologies use broad-band emitters, such as rare-earth/inorganic phosphor materials that produce pre-determined emission spectra, limiting the ability to tailor the final output characteristics of LEDs. The use of specific combinations of quantum dot down-conversion materials allows for precise emission spectra that can improve the overall efficiency of the LED without compromising the color quality.

Figure 2:
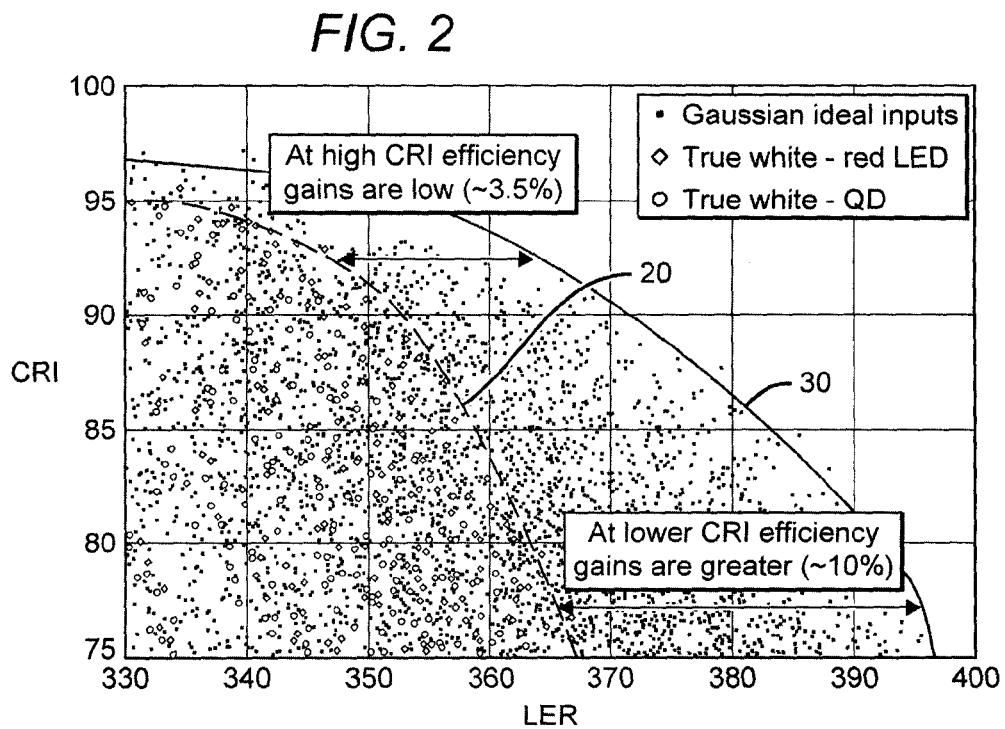
FIG. 2 is a graph which shows a close up of a section of the graph of FIG. 1.

FIGS. 1 and 2 show graphs displaying exemplary outputs from 3 emitters in terms of their Color Rendering Index (CRI) and lumens efficiency of radiation (LER) at a color correlated temperature (COT) of 4,000 K. The first emitter is an ideal emitter or an emitter emulated with four Gaussian spectral inputs (Blue (peak λ455 nm, 20 nm FWHM), Green (peak λ500-540 nm, 10 nm step; FWHM 20-50 nm, 15 nm step), Yellow (peak λ550-590 nm, 10 nm step; FWHM 20-50 nm, 15 nm step), Red (Peak λ605-625 nm, 5 nm step; FWHM 20-50 nm, 15 nm step)). The second emitter is an emitter which includes a blue LED (peak λ455 nm), two broad-band emitters including a blue shifted green (BSG) (LuAG spectra (peak λ516-566 nm, 10 nm step)) and a blue shifted yellow (BSY) (NYAG7 spectra (Peak λ550-590 nm, 10 nm step)), and a red LED (peak λ605-620 nm, 5 nm step). The third emitter is an emitter which includes a blue LED (peak λ455 nm), two broad-band emitters including a blue shifted green (BSG) (LuAG spectra (peak λ516-566 nm, 10 nm step)) and a blue shifted yellow (BSY) (NYAG7 spectra (peak λ550-590 nm, 10 nm step)), and a red quantum dot (peak λ600-620 nm, 5 nm step). FIG. 1 shows an area 12 that incorporates outputs which meet both a high CRI and high LER requirements. FIG. 2 shows this area in more detail displaying, by way of the Gaussian ideals, the area of improvement between lines 20 and 30, which can be achieved by improving current light emitters that use broad-band emitters. As shown in FIG. 2, gains at high CRIs are about 3-5%, whereas larger gains of approximately 10% can be achieved at lower CRIs.

Figure 3:
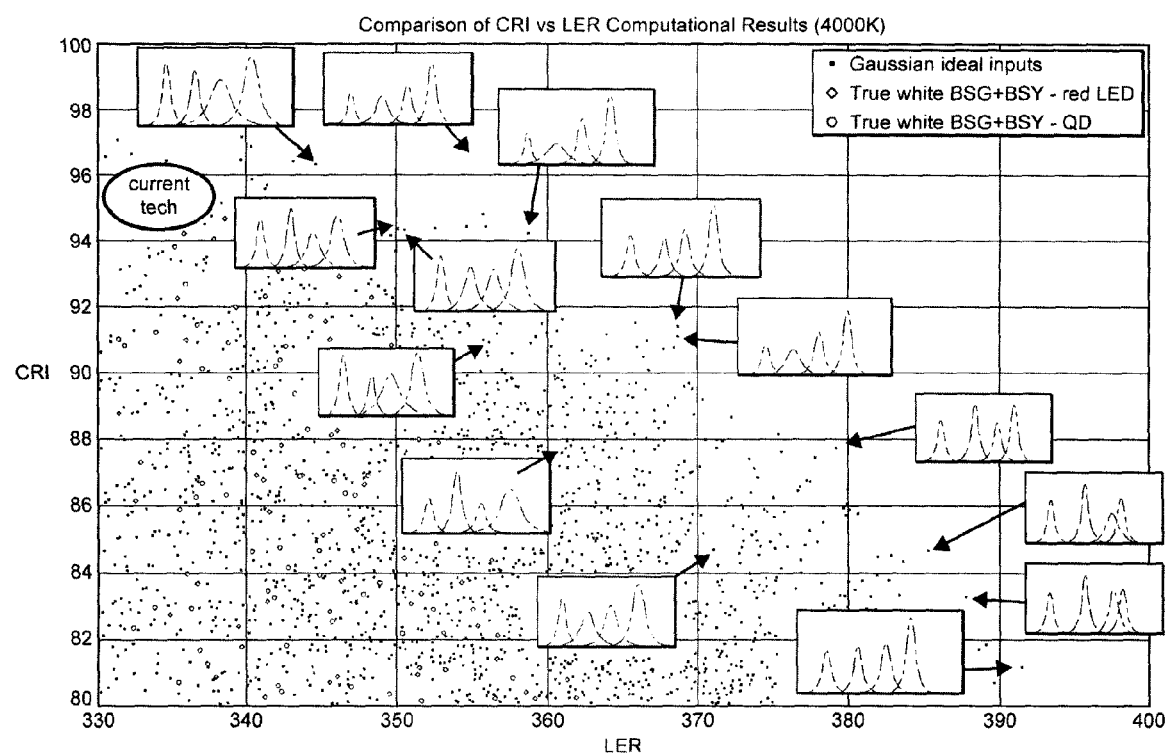
FIG. 3 is a graph which shows spectral examples on a section of the graph of FIG. 1.

FIG. 3 shows an inset of an area of the graph shown in FIG. 1 and shows exemplary spectral graphs for given points in the desired high CRI and high LER area. This allows for the identification of trends within these emitters to be able to estimate the desired emitter spectral make up to obtain high CRI and high LER, emitters. As shown, a few trends may be seen within the given points. First, the higher CRI points have a wider spectral width. Next, for equivalent CRI at a higher LER, a narrower overall spectra is desired, especially in the red spectrum. Also, as CRI increases while maintaining the higher LER, the red and yellow spectra stay narrow while the green spectra widens. Therefore, to tailor or tune an emitter to have an output at a high CRI and LER, it is desired to stay within these identified trends.

The next set of figures, FIGS. 4-9, refer to modeled outputs from 4 exemplary emitters. The first emitter is modeled using the following characteristics: a blue LED (455-460 nm; (peak stepped at) δ=5 nm; FWHM=20 nm) and 3 Gaussian modeled emitters (Green: 500-540 nm; δ=10 nm; FWHM=20, 32, 44 nm. Yellow: 550-590 nm; δ=10 nm; FWHM=20, 32, 44 nm. Red: 600-630 nm; δ=10 nm; FWHM=20, 32, 44 nm). The second emitter is modeled using the following characteristics: a blue LED (455-460 nm; δ=5 nm; FWHM=20 nm) and 3 Quantum Dots (Green: 500-540 nm; δ=10 nm; FWHM=32 nm. Yellow: 550-590 nm; δ=10 nm; FWHM=32 nm. Red: 600-630 nm; δ=10 nm; FWHM=32 nm). The third emitter is comprised of 4 modeled delta functions with FWHM 1 nm line width as follows: Blue: 455-500 nm; δ=5 nm. Green: 505-550 nm; δ=5 nm. Yellow: 555-600 nm; δ=5 nm. Red: 605-650 nm; δ=5 nm. The fourth emitter includes a blue LED, 2 broad-band phosphor emitters and either a red LED (FWHM approximately 20 nm) or a red QD (FWHM approximately 30 nm). The fourth emitter is detailed as: Blue: 449-454 nm; δ=5 nm. LuAG: 516-566 nm; δ=10 nm. NYAG7: 541-591 nm; δ=10 nm. Red: 605-620 nm; δ=5 nm.

Figure 4:
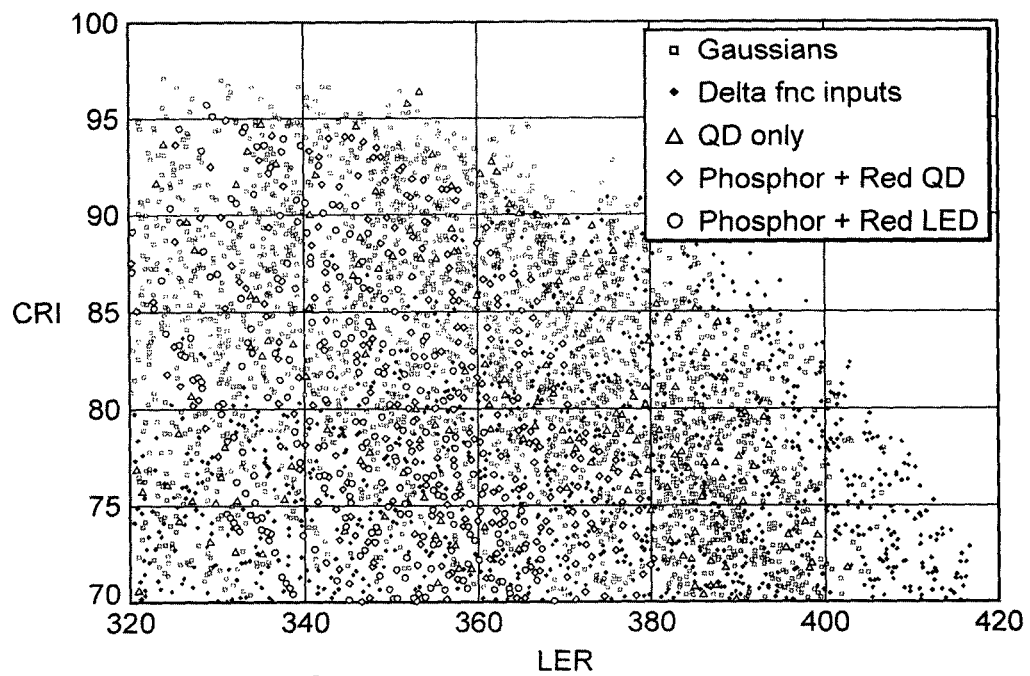
FIG. 4 is a graph depicting a comparison of CRI vs. LER computational results for a number of emitters at 3,500 K.

FIG. 4 shows the exemplary CRI vs. LER outputs of these exemplary emitters. The graph allows identification of trends within the outputs. For example, it is noticed that the delta functions allow for the greatest LER. Also, there is an improvement in LER while decreasing the FWHM of the input spectra. Furthermore, it can be noticed that at 85 CRI, LER gain from the emitter with Phosphor and a Red LED to Phosphor with red quantum dots is approximately −4.4%. The gain to the emitter with blue LED and quantum dots only is approximately +4.9%. Lastly, the gain to the ideal Gaussian spectra is approximately +8.7%.

Figure 5:
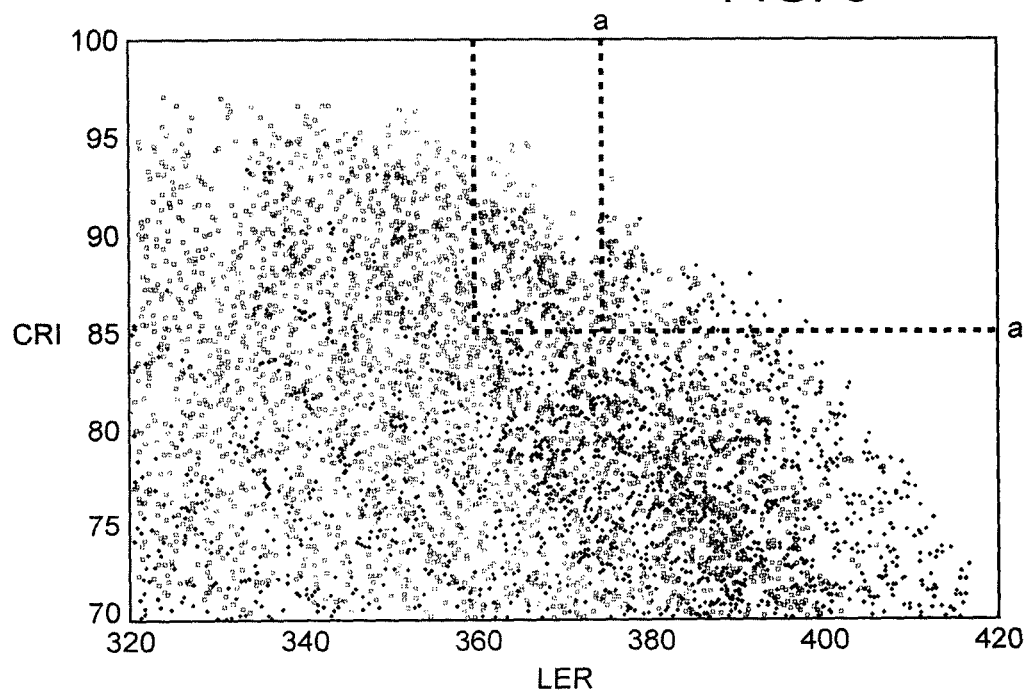
FIG. 5 is a graph showing a subset of the results shown in FIG. 4.

FIG. 5 is a graph which depicts only the CRI vs. LER results of the emitter using the blue LED and 3 Gaussian ideal emitters. These values are a full evaluation of simulated emission spectra generated with narrow-band emitter inputs combined with a blue LED, at a given color correlated temperature (CCT) and can be used to derive specific peak wavelengths of the narrow-band quantum dot emitters that are required in order to gain efficiency without compromising CRI. The graph shows an area of exemplary emissions with the highest CRI and LER moving toward the top right of the graph. These spectral profiles of this emitter which had high CRI and LER, falling into the box created by dotted line a-a, such that the CRI was above 85 and the LER greater than 375, can be set aside to be further analyzed. FIG. 6 shows a set of graphs which show the specific wavelength peaks and FWHM measurements of the 27 points, which were in the box marked by a-a in FIG. 5. As shown, to reach a higher LER, the wavelength of the red emitter must be less than 610 nm. The wavelength of the green emitter should be closer to 530 nm and the wavelength of the yellow emitter should be closer to 570 nm. Additionally, as discussed in relation to FIG. 4 above, narrower FWHM measurements allow for higher LER. Ideally, narrow-band emitters with FWHM of 20 nm would be preferred to tune to the highest possible CRI and LER.

Though narrow-band emitters with a FWHM of 20 nm are preferred, currently, 30-44 nm FWHM quantum dots are more readily available. A red LED may be used as a narrow-band emitter in the red spectrum and would have a FWHM of 20 nm. Therefore, the table of FIG. 7 sets out a subset of the 27 points from FIGS. 5 and 6, which include only the points that had green and yellow inputs over 20 nm and an R9 measurement over 0. An R9 measurement refers to the red spectrum allowing light to have a warmer appearance more similar to candlelight. The emission spectra shown in the table of FIG. 7 include the type of emission profiles that light emitters can be tuned for, to achieve high CRI and LER values, with the narrow-band emitters currently readily available. As narrow-band emitters with narrower FWHM values became available, it may be more advantageous to use those in place of the ones outlined in FIG. 7.

Figure 8:
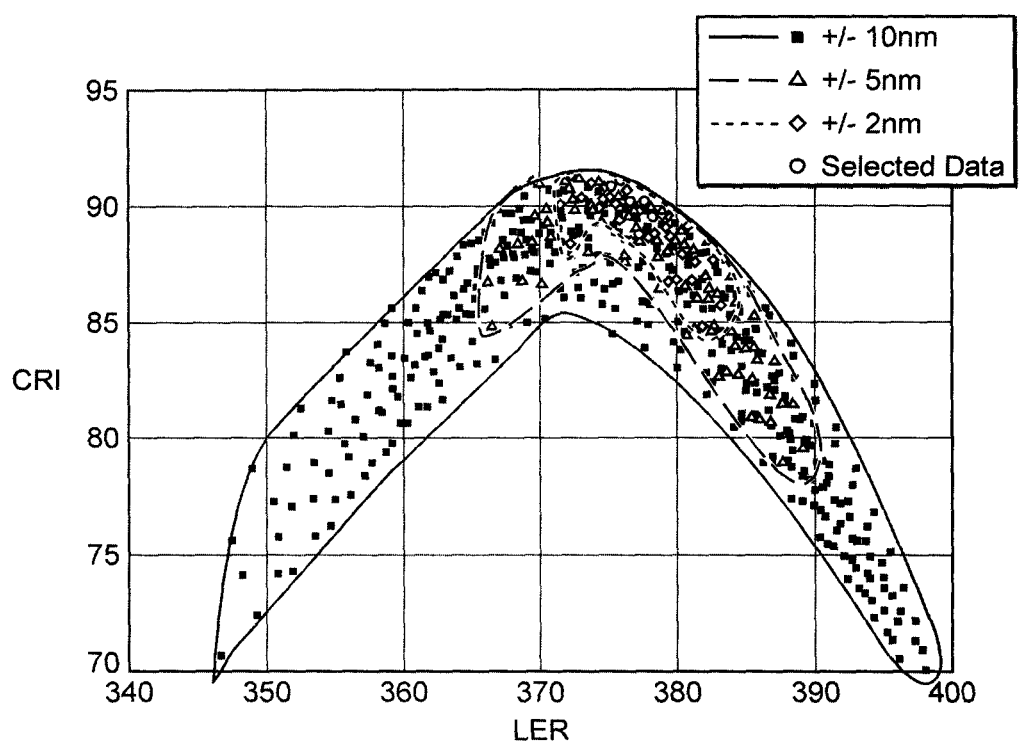
FIG. 8 is a is a graph of the subset of points in FIG. 7 with additional points showing adjustments for tolerances.

FIG. 8 models the points in FIG. 7 with peak wavelength tolerances of ±10 nm, ±5 nm, and ±2 nm, to demonstrate how variations and changes in the peak wavelength may impact CRI and LER values. As shown, to maintain a desirable CRI value over 80, tolerances of the peak wavelength should not exceed approximately ±2 nm.

Figures 9, 13A, 13B:
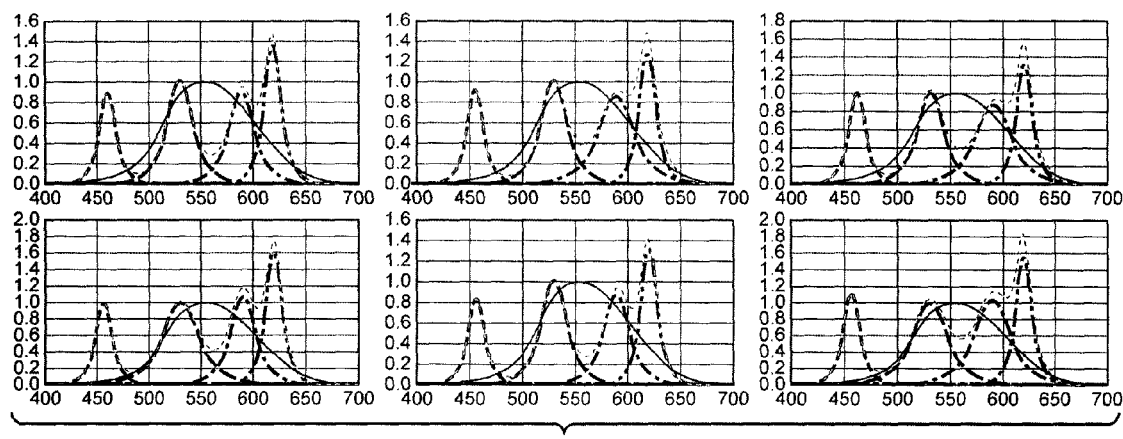
FIG. 9 is a set of spectral graphs of the 6 points described in FIG. 7.
FIG. 13a is a table showing emitter peak wavelengths for a configuration at 3,000 K.
FIG. 13b is a table showing emitter peak wavelengths for a configuration at 3,500 K.

FIG. 9 shows spectral graphs of the 6 points detailed in FIG. 7. Comparing the graphs of these 6 points allows for the identification of trends. The spectra of the selected high CRI/LER all have a characteristic shape, which includes a blue peak, green peak, and a red/orange double peak that resembles a single wide peak. The data shown in FIGS. 5-9 is based on emissions for a CCT of 3,500 K. Changing the desired or target CCT would impact the specific data points and the spectral graphs shown; however, the characteristic shape of the spectral graphs for ideal points of other CCT values should remain the same, with only the peak wavelength values shifting.

Figure 10:
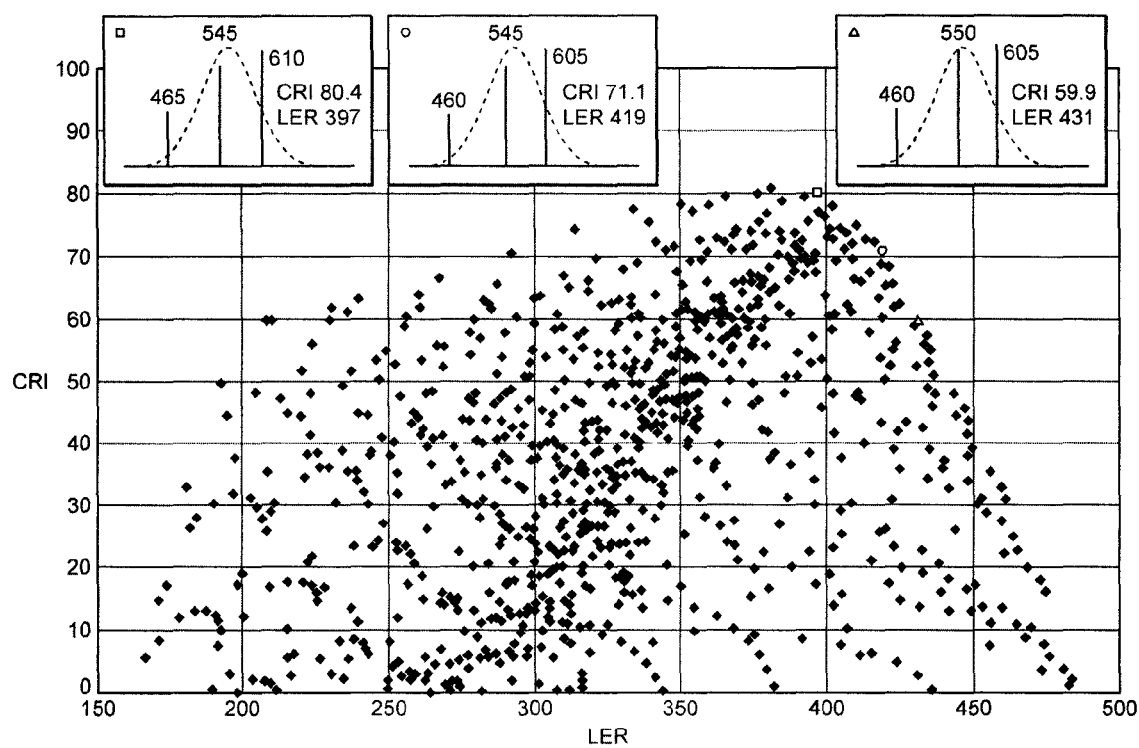
FIG. 10 is a graph showing additional CRI vs. LER points for various emission profiles.
Figure 11:
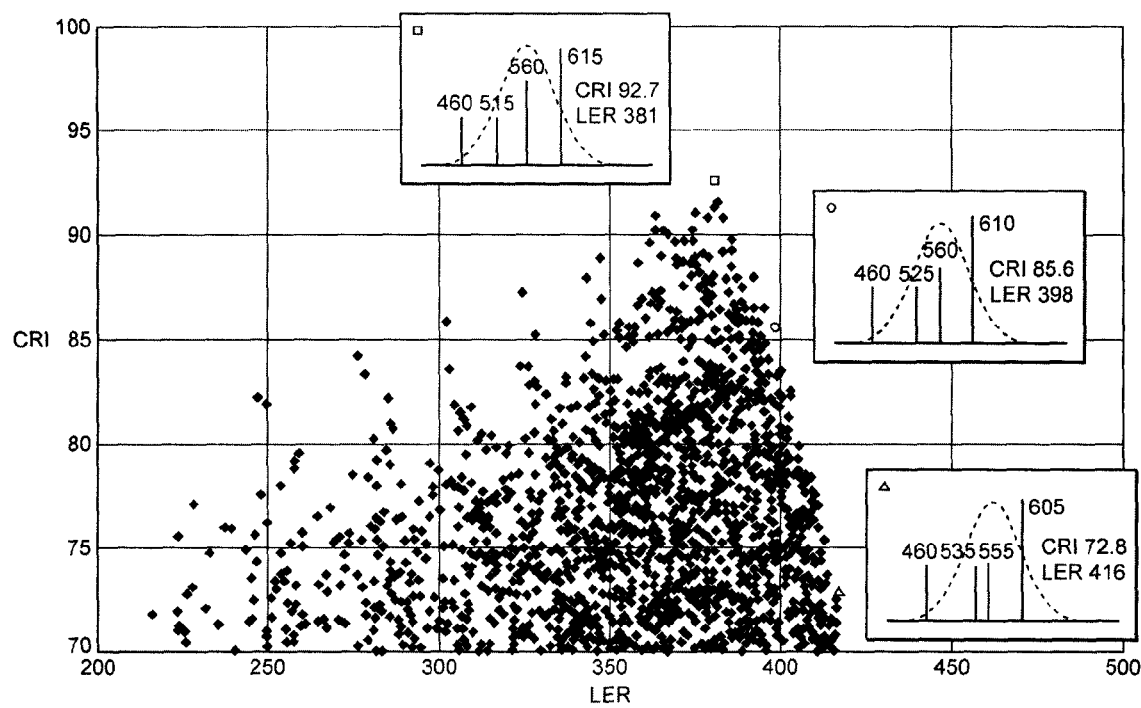
FIG. 11 is a graph showing additional CRI vs. LER points for various emission profiles.

FIGS. 10 and 11 show simulations of delta function inputs at a CCT of 3,500 K. FIG. 10 shows the simulation of 3 delta function inputs. The exemplary points chosen for further detail demonstrate how changes in the peak wavelength can impact CRI. FIG. 11 shows the simulation of 4 delta function inputs. The exemplary points chosen for further detail demonstrate how changes in the peak wavelength can impact CRI. It is important to note that lower red peak wavelengths impact the CRI negatively.

These figures and data above allow the estimation of idealized spectral emissions, which can be used to obtain a desired CRI/LER at a designated CCT. As described, quantum dots, due to their narrow-band emission profiles, can be used in place of broad-band emitters to more exactly tune emissions to achieve these desired specifications.

Figure 12:
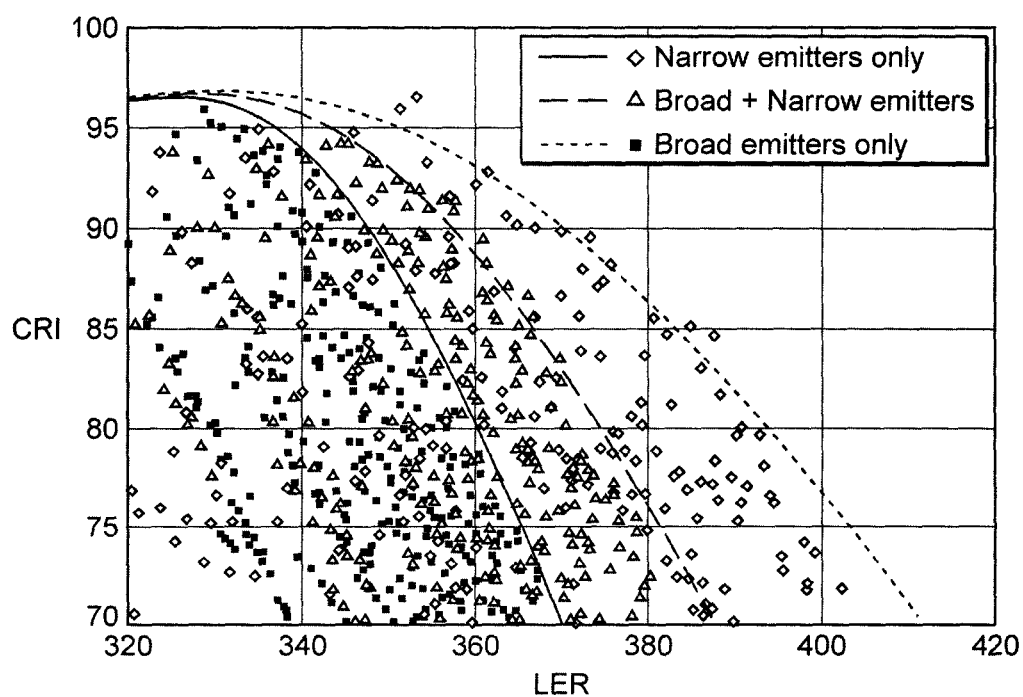
FIG. 12 is a graph showing additional CRI vs. LER points for a variety of emitters.

A first embodiment comprises the optimal white emission spectra at a series of color correlated temperatures (CCT) that have improved lumen efficiency by utilizing narrow-band quantum dot emitters to replace or work in conjunction with traditional broad phosphor emitters. The example in FIG. 12 depicts the lumens efficiency of radiation (LER) tradeoff with the color rendering index (CRI) of various emission spectra derived from either broad emitters, narrow emitters or a combination of broad and narrow emitters that are optically pumped with a blue LED. The simulated white spectra of the narrow-band quantum dot emitters have the highest LER for a given CRI, and therefore can be used to improve the overall efficiency of the system without compromising color quality.

As shown in FIG. 12, the tradeoff in CRI (color rendering index) with LER (lumen efficiency of radiation) improves with the addition of narrow-band emitters. For a given CRI value, the broad emitters (traditional phosphors) are least efficient [Red], a mixture of broad and narrow emitters improves efficiency [Blue], and a fully narrow emitter system has the highest efficiency [Yellow].

There are specific peak wavelengths of the narrow-band quantum dot emitters that are required in order to gain in efficiency without compromising CRI. These values are derived from a full evaluation of simulated emission spectra generated with input narrow-band emitters combined with a blue LED, at a given color correlated temperature (CCT), such as the evaluation and simulation shown in FIGS. 5-9. For example, FIG. 13a contains the optimal inputs for high efficiency at 3,000 K CCT using three downconverters with the same spectral width. FIG. 13b contains the optimal inputs for high efficiency at 3,500 K CCT using three downconverters in combination with an LED. Some variables that can be tuned include the number of downconverters used (each with unique emission spectra) and the width of the narrow emission peaks, for example. The spectral width can range from that of a broad emission (~100 nm) to a single line emitter (no spectral width). Additionally, the emission spectra of each downconverter can be Gaussian, a mixture of Gaussians, with asymmetric tailing, multi-modal, a combination of these, or many other spectra.

Figure 14A:
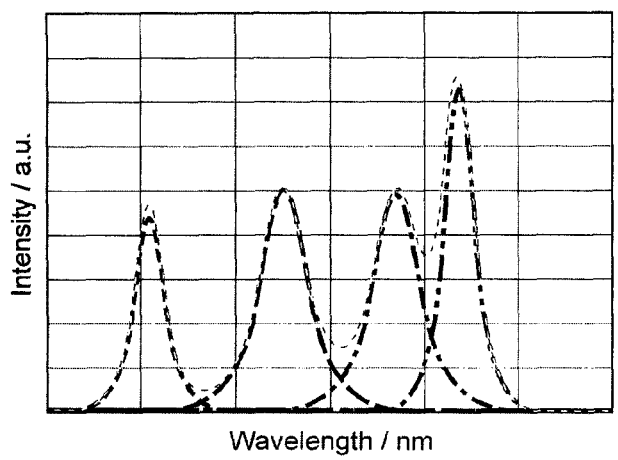
FIG. 14a is a spectral graph for a configuration according to one portion of the range disclosed in FIG. 13b.
Figure 14B:
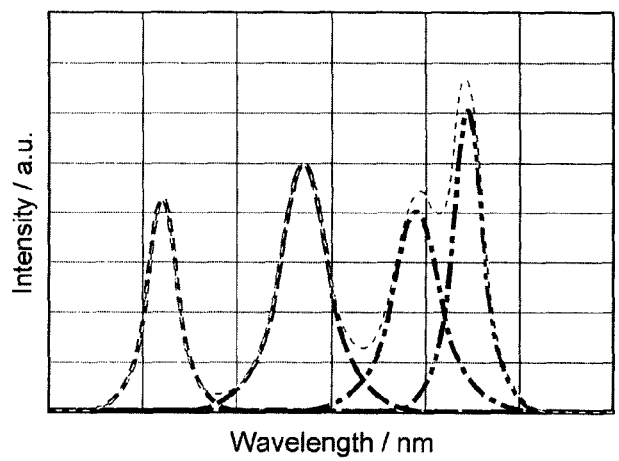
FIG. 14b is a spectral graph for another configuration according to one portion of the range disclosed in FIG. 13b.
Figure 15:
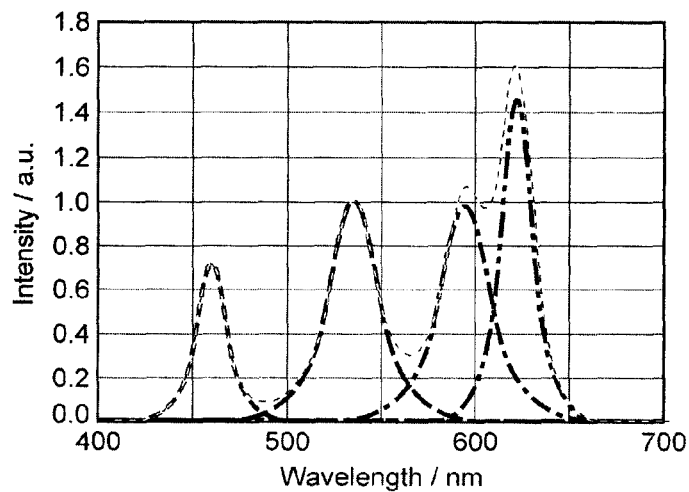

FIGS. 14a and 14b show exemplary spectral graphs of the combined spectra of four narrow-emitters that are in the ranges listed in FIG. 14b at 3,500 K, with FIG. 14a being at the low end of the spectral range for each input and FIG. 14b demonstrating the spectral graph at the high end. FIG. 15 demonstrates a similar spectral graph; however, this is for spectra at 3,000 K using blue LED and 3 narrow-band emitters. As described previously, the spectral graphs show similar trends though the peaks are shifted.

Figure 16:
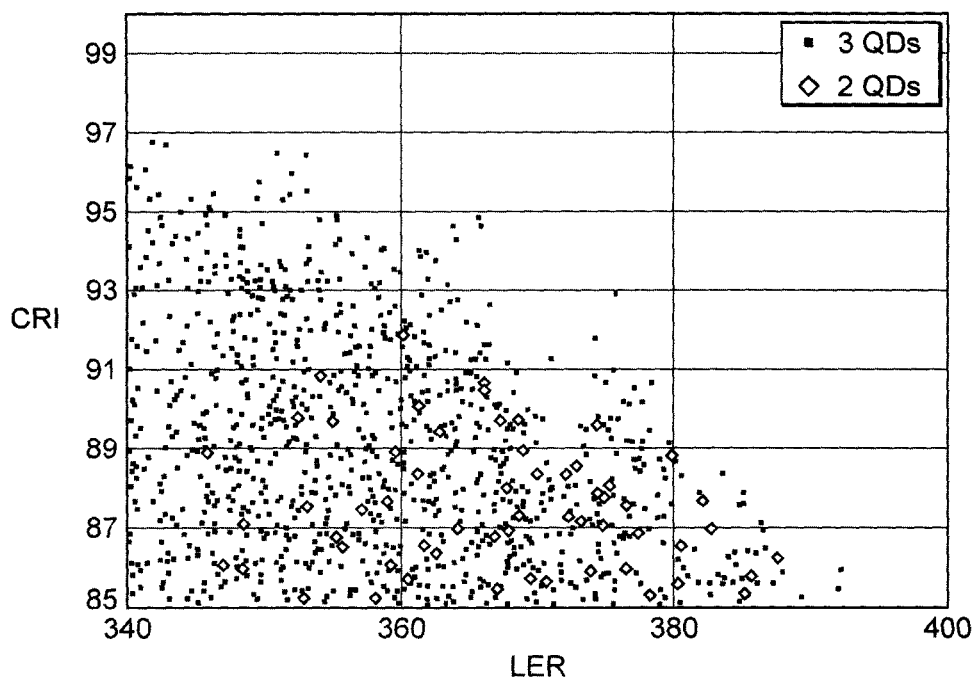
FIG. 16 is a graph depicting exemplary CRI and LER values of emitters with either three quantum dot types or two quantum dot types.

In other embodiments, other numbers of narrow-band emitters may be used with the LED emitter. For example, FIG. 16 shows exemplary emission CRI/LER comparison values for an emitter with 2 quantum dot groups and an emitter with 3 quantum dot groups. Upon evaluation of the CRI/LER values and viewing of the graph, it is noticed that the emitter with three quantum dot emitters with the LED allows for higher CRI values to be achieved; however, this emitter does not have any additional benefit in LER at moderate CRI values (~85). The higher number of emission peaks in the final, or third, spectra leads to higher overall CRI that can be attained. This result or trend can be expected to continue for embodiments with more than three quantum dot emitter groups.

The use of quantum dots in high powered LED applications is limited by the stability in the harsh conditions created. The degradation of the quantum dots can be reduced by creating a physical barrier between the quantum dot and the surrounding environment. One current method of passivating quantum dots uses thin shells that are suitable in normal conditions. The barrier described herein is at least twice the diameter of the quantum dot to prevent degradation from interactions with the LED environment. Additionally, the quantum dot itself can self-destruct from overheating when used with high powered LEDs, and therefore the physical barrier can act as a heat sink to minimize quantum dot thermal degradation. The barrier may be composed of several materials with some suitable materials including the LED chip surface, an inorganic or organic bulk material, or a combination of these.

Figure 17:
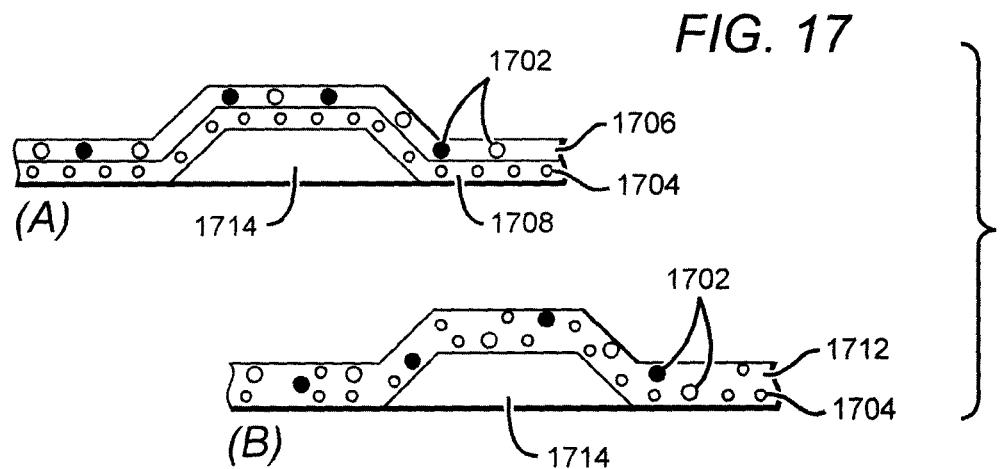
FIG. 17 is a sectional view of two configurations of disposing narrow-band and broad-band emitters over a light emitter.

Another embodiment comprises the fabrication of a white light LED with a combination of traditional broad emission phosphors and narrow-band quantum dot emitters. In FIG. 17, thin layers of quantum dots 1704 and phosphors 1702 are coated onto a blue LED 1714 surface in either a blended (B) or separated multi-layer approach (A). The multi-layer approach is useful when re-absorption effects between emitters are an issue. For example, in FIG. 17 section A, the layering of the narrow-band red emitter 1704, in layer 1708, below the green and yellow phosphors 1702, in layer 1706, prevents absorption of the yellow/green emission by the red emitter. Though only two layers are shown, it should be understood that any number of layers may be used and in any desirable order. It is also possible to have the opposite scenario, where the narrow emitters 1704 are placed above the broad emitters 1702. In a mixed system, the complication of adding multiple layers is avoided by incorporating all the downconverter materials in a single system 1712 (FIG. 17 section B). It should be appreciated that any narrow-band emitters and broad-band emitters can be incorporated in the manner described above. Furthermore, in other embodiments, it is not necessary that the LED be a blue LED but may be any light emitter.

Figure 18:
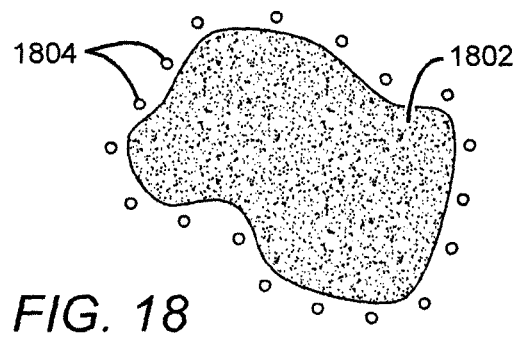
FIG. 18 is a sectional view depicting a number of narrow-band emitters tethered to a broad-band emitter.

Another embodiment is an alternative to separating the quantum dot and rare-earth phosphor downconverter materials. This involves the combination of the two in a single particle, or tethering of one to the other. This single particle would be made by tethering the smaller (nano-scale) quantum dots 1804 to the larger (micron-scale) phosphors 1802 either on the surface or within pores (FIG. 18). This strategy allows for a homogenous mixture of quantum dots and phosphors throughout, which can be difficult to obtain with a simple mixture of the smaller quantum dots with the larger phosphor particles due to gravitational separation. The phosphor particle in some cases may act as a heat sink for the quantum dot emitters, preventing the quantum dots from overheating.

In yet another embodiment, a fully narrow-band quantum dot system may be used. Quantum dots of different peak wavelengths are combined either in separated multi-layers, a single blended layer, or a combination of both. The down-conversion of blue light from the LED due to the quantum dot emitters creates a combined white light emission that can be easily tailored by changing various properties such as layer thickness, concentration of emitters, and combination of emitters, for example.

Various deposition methods are possible in all the fabrication examples. Many methods of depositing the particles can be used, such as aerosol or spray coating, drop casting, doctor blade coating, spin-coating, and several others. The medium in which the downconverters are placed on the LED chip can be a polymer matrix that cures upon heating or irradiation with blue or other (UV, IR, visible) light. The medium can also be an inorganic precursor, such as a sol-gel, for example, that cures upon heating or other means after deposition. The medium can also be a solvent that evaporates after deposition. In this case, there is no matrix surrounding the downconverter. An additional matrix, whether organic or inorganic, can be applied after the initial deposition of downconverter for increased stability and/or reliability.

Narrow-band quantum dot emitters may be thermally sensitive and may have a tendency to oxidize, causing instability. In yet another embodiment, the reliability of the narrow-band quantum dot emitters in the harsh LED environment (high temperature and high blue optical flux density) is maintained by incorporation of protection features. A physical barrier, whether it is an organic (silicone, polymeric resins, etc.) or inorganic (oxides, nitrides, etc.) is coated around the quantum dot to protect the quantum dot from the environment. This barrier would prevent the oxidation, hydrolysis, and other chemical degradation mechanisms that may occur. This barrier can be thin (roughly the same dimensions as the quantum dot); however, a thicker coating could create a more robust physical/chemical barrier. A thicker coating may also be desirable in creating particular scattering or other optical characteristics. A strong barrier would be applicable for harsh environments, such as those areas near an operating LED. The barrier would also prevent quantum dots from interacting with each other, as the physical barrier dimensions would be the closest that two particles could be to each other. This would help prevent electrical and optical cross-talk between downconverters, especially when in high concentrations. Additionally, a thick enough barrier over a quantum-dot emitter could be large enough to create scattering (~above 2-5 nm in diameter). The larger final quantum-dot with barrier particles could be mixed in different amounts with less scattering, smaller downconverters to have an optimal amount of scattering to improve color quality and color mixing. The larger particles could be co-mixed or layered, of either a single size or containing a size distribution for optimal color qualities.

The barrier can be inert, or it can have an active role. For example, the barrier can be optically active or dissipate heat from the quantum dot as it is operating as a downconverter at high flux densities. This barrier may act as a heat sink, therefore limiting any additional thermal quenching occurring at the quantum dot during operation. The barrier can be an inorganic material (oxides, nitrides, semi-conductors, etc.), or it can be a thermally conductive organic material, so long as the barrier does not interfere with the absorption or emission of the active quantum dot.

The density, porosity, and/or permeability of the barrier coating can also be controlled, with the least porous being suitable in some embodiments, as it would create the strongest barrier between the quantum dot and its surroundings. Methods of forming this would include epitaxial growth of the coating, wet chemical synthesis, plasma coating, or vapor deposition methods. Other coating methods would include using a sol-gel approach to inorganic coatings, such as silica that may require further densification through sintering methods. Many other methods are also possible.

The structure of the barrier coating can be a combination of more than one material, in which each material is a distinct layer over the next. The shape of each layer can be spherical, rod-like, planar, tetragonal, and many others, depending on synthesis conditions. These structures can have an active role in the optical properties, or they can have a passive role in determining the quantum dot solubility, size, packing density, or any hierarchal 2-D or 3-D structure. Additionally, the barrier may include other materials such as scattering particles, if desired.

Figure 19:
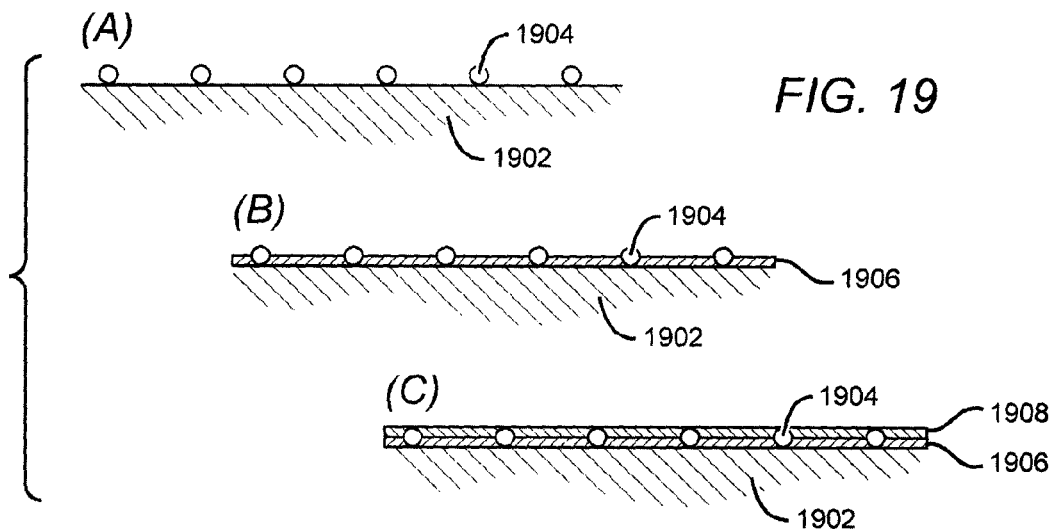
FIG. 19 is a sectional view depicting three configurations of narrow-band emitters disposed over a light emitter surface.

Another embodiment comprises a thermal heat sink additional to any coating on the quantum dots, if a coating is included, which may be used to further cool the quantum dots in LED operating conditions. As shown in FIG. 19, in some embodiments, the LED surface 1902, or other light emitter surface, itself may be used as a heat sink during operation (as shown in section A of FIG. 19). The contact point between the quantum dot 1904 and the surface 1902 would provide a thermal dissipation pathway. To improve that dissipation pathway and allow for greater contact, a thermally conductive layer 1906 that can penetrate between the quantum dots 1904 and the underlying surface 1902 can be used as shown in section B of FIG. 19. Additionally, a barrier coating 1908 can be placed on top of the quantum dots 1904 to hold them in place or protect them from the surrounding environment, as shown in section C of FIG. 19. This barrier layer 1908 may also assist in thermal dissipation. The under-layer and over-layer may be of the same or different compositions and/or purpose. In some configurations, the volume of the thermally conductive layers (over and under layer) compared to the volume of quantum dots the layers are over should be maintained similarly to volumes of such layers over broad-band emitters, such as phosphor. To maintain safe surface temperatures of phosphors, the thermally conductive layer is usually applied at a volume greater than 20 times the volume of the phosphor, up to 100+ times greater. Therefore, similar volumes of greater than 20 to greater than 100 times thermally conductive material to quantum dot volume should be employed to maintain safe surface temperatures. Additionally, in other embodiments, coatings, whether those shown in FIG. 17, 19 or referenced as coating individual quantum dots as a barrier, should have a refractive index substantially similar to any matrix material, i.e. enacpasulant, applied over the light emitter or surrounding the quantum dots. This would minimize the scattering of light at the coating to encapsulant interface. Generally, the refractive index ranges that coatings should be within include 1.4, preferably about 1.50+/−0.05, or larger than 1.55, to accommodate encapsulants.

Figure 21:
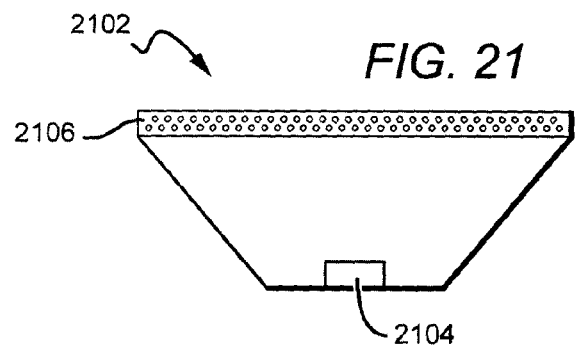
FIG. 21 is a sectional view of a light emitter package with a remote conversion material.

In yet other embodiments, the quantum dots can be disposed on other surfaces, within encapsulants, or even remote to the emitter in a remote converter configuration. The use of remote conversion materials are shown and described in U.S. patent application Ser. No. 13/029,025, to Tong, et al., entitled "LED LAMP INCORPORATING REMOTE PHOSPHOR WITH HEAT DISSIPATION FEATURES," which is commonly owned with the present application and incorporated by reference herein. FIG. 21 shows one embodiment of an emitter package 2102 with a remote converter configuration, such that the converters 2106, whether broad-band or narrow-band are placed remote to the light emitter 2104.

Figure 20:
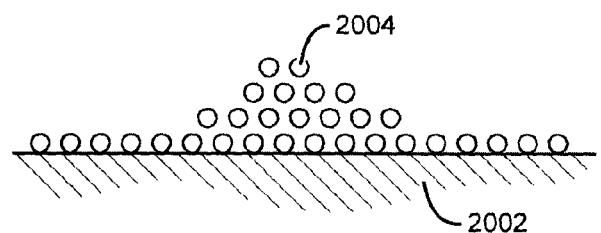
FIG. 20 is a sectional view depicting a configuration of narrow-band emitters disposed over a light emitter surface.
Figure 22:
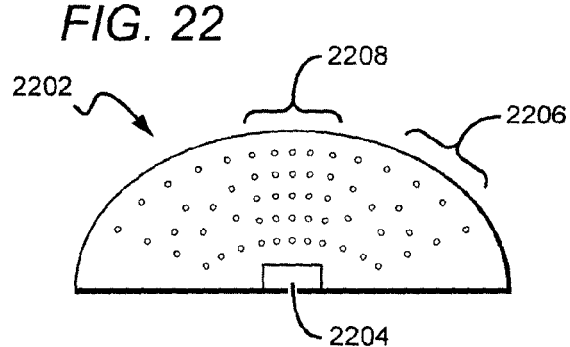
FIG. 22 is a sectional view of a light emitter package with narrow-band emitters in varying densities.

In other embodiments, quantum dots can be disposed in various concentrations over the emitter. In some configurations, different types of quantum dots may be in different regions and in other configurations there may be regions of different quantum dot densities. For example, as shown in FIG. 20, the concentration of the quantum dots on the LED surface may be varied, from ultra-dilute up to densely packed. In the highest density case, the optimal structure of the quantum dot incorporates a thick physical barrier as described above. FIG. 20 depicts an emitter surface 2002 with an array of quantum dots 2004, such that an area of the array of quantum dots is more densely packed than other areas. The densely packed array can range from a single layer to multi-layers. The large-area coverage can be fully-densely packed or non-uniform, or with periodic uniformity at a hierarchal level. FIG. 22 depicts another embodiment of a package 2202 with converters, such as quantum dots, disposed within an encapsulant material with areas of different density. As shown, the center has a higher density region 2208 than the adjacent area of lower density 2206 over the light emitter 2204. In other embodiments, densities may be configured in other manners, such as an area of higher density on an area further or closer to the light emitter, or any other configuration.

Embodiments and configurations of the present invention have many different applications. For example, the present invention can be used with highly efficient and good color quality LED devices, such as white light LEDs, for example. However, the present invention may also be used for other applications, including UV-light down-conversion or down-conversion to IR light, just to name a few. Such devices may be used in LEDs for medical applications, for example. Many different applications are possible.

Although the present invention has been described in detail with reference to certain preferred configurations thereof, other versions are possible. For example, the present invention can be used with many different device configurations (geometries, shape, size and other elements on, in and around the LED device) to improve various aspects of device performance. Therefore, the spirit and scope of the invention should not be limited to the versions described above. Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

We claim:

1. A light emitting device, comprising:
   a first light emitter on a support structure;
   a plurality of narrow-band emitters, such that the first light emitter and the plurality of narrow-band emitters in combination provide an emission profile at a designated color correlated temperature (CCT) with a Color Rendering Index (CRI) of at least 80 and a lumens efficiency of radiation (LER) characteristic of at least 360, wherein said plurality of narrow-band emitters comprises at least two pluralities of quantum dots with different concentrations around said first light emitter, wherein said plurality of narrow-band emitters are within a barrier layer, said barrier layer on and conformal to said first light emitter, wherein part of said first light emitter is interposed between said barrier layer and said support structure; and a broad-band layer comprising a plurality of broad-band emitters on said first light emitter, wherein said narrow-band emitters are closer to said first light emitter than said broad-band layer.

2. The device of claim 1, in which the plurality of narrow-band emitters includes a third plurality of quantum dots.

3. The device of claim 1, in which the plurality of narrow-band emitters includes a second light emitter.

4. The device of claim 1, in which the CRI is >85 and the LER is >375.

5. The device of claim 1, in which the narrow-band emitters comprise a Full Width Half Maximum (FWHM) of 20-44 nm.

6. The device of claim 1, in which the designated CCT is 3,500 K and the plurality of narrow-band emitters are comprised of at least two pluralities of quantum dots, the first plurality of quantum dots comprising a peak wavelength of 525-535 nm and the second plurality of quantum dots comprising a peak wavelength of 585-595 nm.

7. The device of claim 6, further comprising a third plurality of quantum dots comprising a peak wavelength of 605-625 nm.

8. The device of claim 6, further comprising a second light emitter comprising a peak wavelength of 605-625 nm.

9. The device of claim 1, in which the designated CCT is 3,000 K, further in which the plurality of narrow-band emitters are comprised of at least two pluralities of quantum dots and at least a third narrow-band emitter, the first plurality of quantum dots comprising a peak wavelength of 520-535 nm and the second plurality of quantum dots comprising a peak wavelength of 585-595 nm, the third narrow-band emitter comprising a peak wavelength of 618-622 nm.

10. The device of claim 1, in which said plurality of broad-band emitters and said plurality of narrow-band emitters are in separate layers over the first light emitter.

11. The device of claim 1, in which said plurality of broad-band emitters and said plurality of narrow-band emitters are mixed within at least one layer over the first light emitter.

12. The device of claim 1, in which the light emitter is a light emitting diode (LED).

13. The device of claim 1, in which at least a portion of the plurality of narrow-band emitters are tethered to said plurality of broad-band emitters.

14. The device of claim 13, in which said plurality of broad-band emitters acts as a heat sink for at least a portion of the plurality of narrow-band emitters.

15. The device of claim 1, in which the plurality of narrow-band emitters are comprised of narrow-band emitters of different peak wavelengths and each of said plurality of narrow-band emitters of different wavelengths are in separated multi-layers.

16. The device of claim 1, in which the plurality of narrow-band emitters are comprised of narrow-band emitters of different peak wavelengths and each of said plurality of narrow-band emitters of different wavelengths are in at least one blended layer.

17. The device of claim 1, in which the plurality of narrow-band emitters are comprised of narrow-band emitters of different peak wavelengths and said plurality of narrow-band emitters of different wavelengths are in separated multi-layers and at least one blended layer.

18. The device of claim 1, in which the plurality of narrow-band emitters are comprised of quantum dots, and each of at least a portion of the quantum dots are coated by a barrier layer.

19. The device of claim 18, in which the barrier layer is optically active.

20. The device of claim 18, in which the barrier layer is thermally conductive.

21. The device of claim 18, further comprising an encapsulant over the first light emitter and quantum dots, in which the barrier layer comprises a refractive index similar to the encapsulant material.

22. The device of claim 18, in which the quantum dots are in contact with a heat sink.

23. The device of claim 22, in which a surface of the first light emitter acts as the heat sink.

24. The device of claim 18, in which a thermally conductive layer is in contact with at least a portion of the first light emitter and at least a portion of the quantum dots.

25. The device of claim 18, in which a thermally conductive layer is over and in contact with at least a portion of the quantum dots.

26. The device of claim 25, in which the thermally conductive layer comprises a volume at least 20 times larger than an active region of the quantum dots.

27. The device of claim 18, in which at least a portion of the quantum dots are over at least a portion of a surface of the first light emitter.

28. The device of claim 27, in which at least a portion of the quantum dots are over the first light emitter in varied densities.

29. The device of claim 1, in which at least a portion of the plurality of narrow-band emitters receive and convert at least a portion of light emitted from the first light emitter.

30. A lighting emitting device, comprising:
a first light emitter;
at least three pluralities of narrow-band emitters, each emitting at a different peak wavelength range, such that the first light emitter and the at least three pluralities of narrow-band emitters in combination provide a spectral emission profile at a designated CCT with desired CRI and LER characteristics, in which the desired CRI is >80 and the desired LER is >360;
at least two of the at least three pluralities of narrow band emitters comprising pluralities of quantum dots, wherein said pluralities of quantum dots comprise different concentrations around said first light emitter;
wherein said at least three pluralities of narrow-band emitters are within a barrier layer, said barrier layer on and conformal to said first light emitter; and
a thermally conductive layer between said first light emitter and said barrier layer.

31. The device of claim 30, in which the desired CRI is >85 and the desired LER is >375.

32. The device of claim 30, in which the narrow-band emitters comprise a Full Width Half Maximum (FWHM) of 20-44 nm.

33. The device of claim 30, in which a broad-band emitter acts as a heat sink for at least a portion of the pluralities of narrow-band emitters.

34. The device of claim 30, in which the pluralities of narrow-band emitters are comprised of quantum dots, and each of at least a portion of the quantum dots are coated by a barrier layer.

35. The device of claim 34, in which the quantum dots are in contact with a heat sink.

36. The device of claim 34, in which said thermally conductive layer is over and in contact with at least a portion of the quantum dots.

37. A light emitting device, comprising:
a first light emitter;
a plurality of narrow-band emitters configured to reduce environmental damage to the plurality of narrow-band emitters, the plurality of narrow-band emitters also configured to include a heat dissipation feature, in which the plurality of narrow-band emitters are comprised of quantum dots, and each of at least a portion of the quantum dots are coated by a barrier layer, wherein said coating is on and conformal to a surface of said first light emitter and has a thickness of at least double the diameter of said quantum dots; and
a thermally conductive layer between said first light emitter and said barrier layer.

38. The device of claim 37, in which the at least one light emitter and the plurality of narrow-band emitters in combination provide an emission profile at a designated color correlated temperature (CCT) with a Color Rendering Index (CRI) of at least 75 and a lumens efficiency of radiation (LER) characteristic of at least 350.

39. The device of claim 38, in which the desired CRI is >80 and the desired LER is >360.

40. The device of claim 38, in which the desired CRI is >85 and the desired LER is >375.

41. The device of claim 37, in which the narrow-band emitters comprise a Full Width Half Maximum (FWHM) of 20-44 nm.

42. The device of claim 37, in which a broad-band emitter acts as the heat dissipation feature for at least a portion of the plurality of narrow-band emitters.

43. The device of claim 37, in which the plurality of narrow-band emitters are comprised of narrow-band emitters of different peak wavelengths.

44. The device of claim 37, in which the heat dissipation feature is comprised of the barrier layer, such that the barrier layer is thermally conductive.

45. The device of claim 37, in which the heat dissipation feature comprises a thermally conductive layer, the thermally conductive layer is over and in contact with at least a portion of the quantum dots.

46. The device of claim 45, in which the thermally conductive layer comprises a volume at least thirty times larger than an active region of the quantum dots.

47. A method of tuning emitter package output, comprising:
providing a light emitter on a support structure;
providing a plurality of narrow-band emitters with a plurality of peak wavelength ranges, the plurality of peak wavelength ranges chosen such that the combination of the light emitter and the plurality of narrow-band emitters achieve a designated CCT at a desired CRI value of at least 80 and a desired LER value of at least 360;
wherein said plurality of narrow-band emitters comprises at least two pluralities of quantum dots, wherein said at least two pluralities of quantum dots comprise different concentrations around said light emitter;
wherein said plurality of narrow-band emitters are within a barrier layer, said barrier layer on and conformal to said light emitter such that part of said light emitter is interposed between said barrier layer and said support structure; and
providing a broad-band layer comprising a plurality of broad-band emitters on said light emitter, wherein said narrow-band emitters are closer to said light emitter than said broad-band layer.

48. The method of claim 47, in which the desired CRI is >80 and the desired LER is >360.

49. The method of claim 47, in which the desired CRI is >85 and the desired LER is >375.

50. The method of claim 47, further comprising tethering at least a portion of the plurality of narrow-band emitters to a broad-band emitter.

51. The method of claim 47, in which the plurality of narrow-band emitters are comprised of quantum dots, further comprising coating each of at least a portion of the quantum dots with a barrier layer.

52. The method of claim 47, further comprising providing a heat dissipation feature in contact with the plurality of narrow-band emitters.

53. The method of claim 47, further comprising disposing a thermally conductive layer over and in contact with at least a portion of the plurality of narrow-band emitters.

54. The method of claim 53, in which providing the plurality of narrow-band emitters further comprises disposing at least a portion of the quantum dots over at least a portion of a surface of the light emitter.

* * * * *